US008733620B2

(12) United States Patent
Renavikar et al.

(10) Patent No.: US 8,733,620 B2
(45) Date of Patent: May 27, 2014

(54) SOLDER DEPOSITION AND THERMAL PROCESSING OF THIN-DIE THERMAL INTERFACE MATERIAL

(75) Inventors: Mukul Renavikar, Chandler, AZ (US); Susheel G. Jadhav, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1280 days.

(21) Appl. No.: 11/297,722

(22) Filed: Dec. 8, 2005

(65) Prior Publication Data

US 2007/0131737 A1 Jun. 14, 2007

(51) Int. Cl.
   *B23K 1/19* (2006.01)
(52) U.S. Cl.
   USPC ........... 228/254; 228/245; 228/246; 228/249; 228/253; 228/262.1; 228/262.6; 228/262.61
(58) Field of Classification Search
   USPC ................ 228/193, 245, 249, 246, 253, 254, 228/262.1, 262.6, 262.61
   See application file for complete search history.

(56) References Cited

U.S. PATENT DOCUMENTS

| 4,034,469 | A | * | 7/1977 | Koopman et al. ............. 29/825 |
| 7,132,746 | B2 | | 11/2006 | Brandenburg |
| 2002/0000239 | A1 | | 1/2002 | Sachdev et al. |
| 2002/0100986 | A1 | * | 8/2002 | Soga et al. ................. 257/779 |
| 2003/0203188 | A1 | | 10/2003 | H. |
| 2004/0188814 | A1 | | 9/2004 | Houle et al. |
| 2005/0027055 | A1 | | 2/2005 | Dani et al. |
| 2005/0040518 | A1 | | 2/2005 | Brandenburg et al. |
| 2005/0211752 | A1 | | 9/2005 | Hurley et al. |

FOREIGN PATENT DOCUMENTS

| EP | 1508915 A2 | 2/2005 |
| WO | WO-0036893 A2 | 6/2000 |
| WO | WO-03043081 A2 | 5/2003 |
| WO | 2007/067591 A2 | 6/2007 |

OTHER PUBLICATIONS

Massalski, T. B., "Binary Alloy Phase Diagrams", *Materails Park: ASM Interational*, 3, (1990),2295-2296.
International Search Report and written Opinion for PCT Application No. PCT/US2006/046501, mailed on Jun. 12, 2007, 17 Pages.
International Preliminary Report on Patentability for PCT Application No. PCT/US2006/046501, mailed on Jun. 19, 2008, 11 Pages.
Office Action mailed Jun. 19, 2009 in related Chinese Patent Application No. 200680045658, English Translation included, (25 pgs.).

(Continued)

*Primary Examiner* — Aaron Austin
*Assistant Examiner* — Megha Mehta
(74) *Attorney, Agent, or Firm* — Winkle, PLLC

(57) ABSTRACT

A solder is deposited on a heat sink. The solder is first reflowed at a first temperature that is below about 120° C. The solder is second heat aged at a temperature that causes the first reflowed solder to have an increased second reflow temperature. The heat aging process results in less compressive stress in a die that uses the solder as a thermal interface material. The solder can have a composition that reflows and adheres to the die and the heat sink without the use of organic fluxes.

7 Claims, 5 Drawing Sheets

(56) References Cited

OTHER PUBLICATIONS

Office Action Received in Taiwan Patent Application No. 95145716, mailed on Aug. 20, 2009, 4 pages of Taiwan Office Action and 7 pages of English Translation.

Office Action Received in Taiwan Patent Application No. 95145716, mailed on Apr. 9, 2010, 3 pages of Taiwan Office Action and 3 pages of English Translation.

Office Action Received for Korean Patent Application No. 10-2008-7013872, Mailed on May 27, 2010, 7 pages of office Action including 3 pages of English Translation.

Office Action Received for Korean Patent Application No. 10-2008-7013872, Mailed on Aug. 28, 2012, 9 pages of office Action including 4 pages of English Translation.

Office Action Received for Korean Patent Application No. 10-2010-7026789, Mailed on Feb. 13, 2012, 8 pages of office Action including 4 pages of English Translation.

Office Action Received for Korean Patent Application No. 10-2011-7025840, Mailed on Feb. 13, 2012, 5 pages of office Action including 2 pages of English Translation.

Lee, et al., "Au-In Bonding Below the Eutectic Temperature", IEEE Transactions on Components, Hybrids and Manufacturing Technology, vol. 16, Issue No. 3, May 1993, pp. 311-316.

So, et al., "High Temperature Joints Manufactured at Low Temperature", IEEE Electronic Components and Technology Conference, 1998, pp. 284-291.

* cited by examiner

SOLDER DEPOSITION AND THERMAL PROCESSING OF THIN-DIE THERMAL INTERFACE MATERIAL

TECHNICAL FIELD

Embodiments relate generally to integrated circuit fabrication. More particularly, embodiments relate to heat management technology with microelectronic devices.

TECHNICAL BACKGROUND

Heat spreaders are used to remove heat from structures such as an integrated circuit (IC). An IC die is often fabricated into a microelectronic device such as a processor. The increasing power consumption of processors results in tighter thermal budgets for a thermal solution design when the processor is employed in the field. Accordingly, a thermal interface solution is often needed to allow the die to reject heat more efficiently.

Various techniques have been employed to transfer heat away from a die. These techniques include passive and active configurations. One passive configuration involves a conductive material in thermal contact with the backside of a packaged die. This conductive material is often a heat pipe, heat sink, a slug, a heat spreader, or an integrated heat spreader (IHS). Adhesion of the IHS to the die is accomplished with a thermal interface material (TIM) such as a solder. The TIM adheres to the backside of the die and to the die-side of the IHS. Proper reflow of the TIM often is at temperatures in excess of 280° C. Because heating of the TIM also results in heating of the IHS and the IC die, subsequent cooling transfers significant compressive stresses to the die.

As die thicknesses grow smaller, the use of fluxes to protect the TIM composition during reflow, can hinder the adhesion of the TIM to the IHS and to the die backside. If not conducted properly, a flux-assisted TIM reflow can cause significant voids between the die and the IHS.

BRIEF DESCRIPTION OF THE DRAWINGS

In order to depict the manner in which the embodiments are obtained, a more particular description of embodiments briefly described above will be rendered by reference to specific embodiments that are illustrated in the appended drawings. Understanding that these drawings depict only typical embodiments that are not necessarily drawn to scale and are not therefore to be considered to be limiting of its scope, the embodiments will be described and explained with additional specificity and detail through the use of the accompanying drawings in which.

DETAILED DESCRIPTION

Embodiments in this disclosure relate to a solder thermal interface material (TIM) that is disposed between a die and a heat spreader. Embodiments also relate to solder TIM metallurgies that are useful for heat solutions with microelectronic devices that are integrated into a die.

The following description includes terms, such as upper, lower, first, second, etc. that are used for descriptive purposes only and are not to be construed as limiting. The embodiments of an apparatus or article described herein can be manufactured, used, or shipped in a- number of positions and orientations. The terms "die" and "chip" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

Reference will now be made to the drawings wherein like structures will be provided with like suffix reference designations. In order to show the structures of various embodiments more clearly, the drawings included herein are diagrammatic representations of integrated circuit structures. Thus, the actual appearance of the fabricated structures, for example in a photomicrograph, may appear different while still incorporating the essential structures of the illustrated embodiments. Moreover, the drawings may show only the structures necessary to understand the illustrated embodiments. Additional structures known in the art have not been included to maintain the clarity of the drawings.

Figure 1:
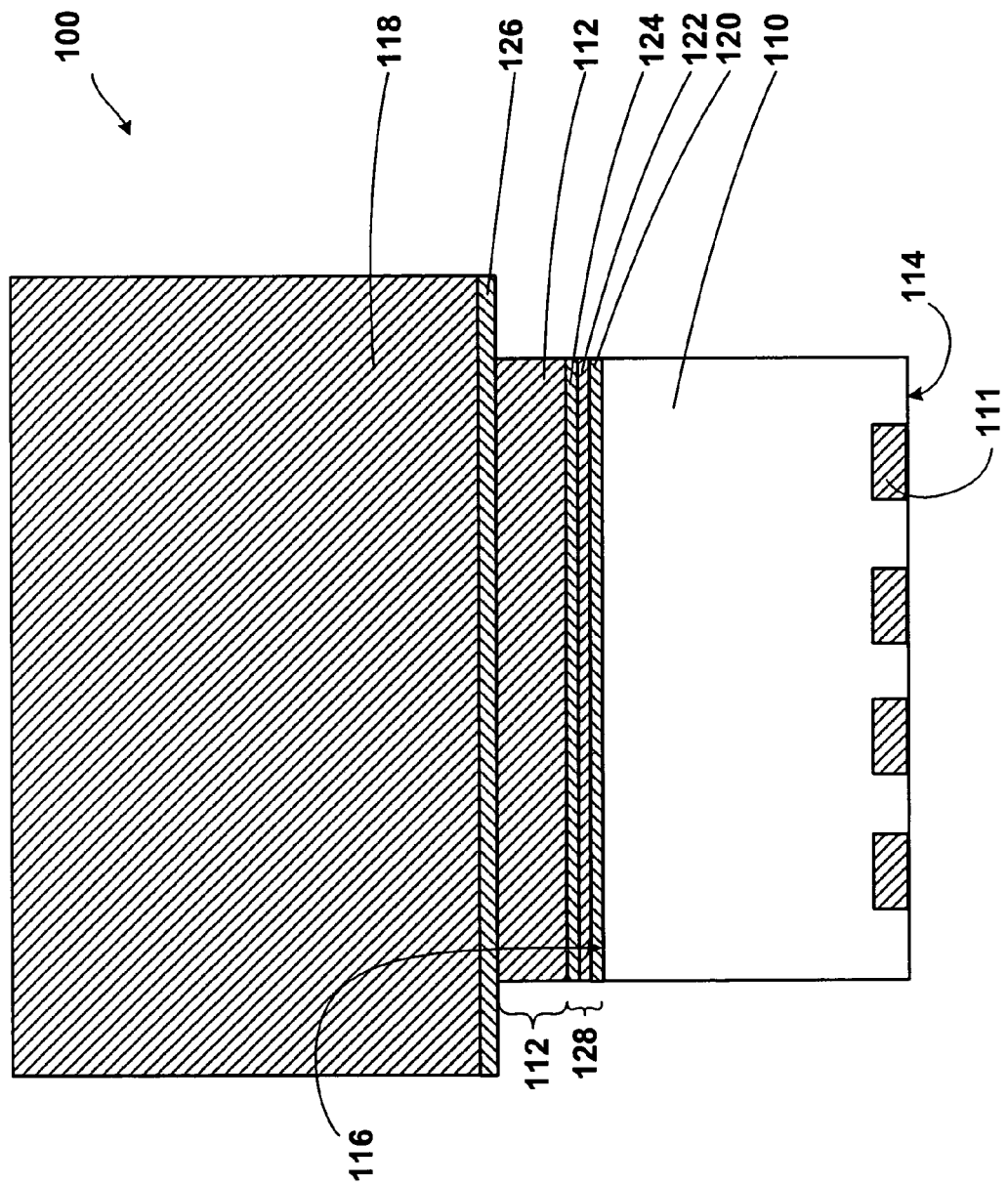
FIG. 1 is a cross-section elevation diagram of a photomicrograph that exhibits a solder thermal interface material between a die and a heat spreader according to an embodiment.

FIG. 1 is a cross-section elevation diagram of a photomicrograph 100 that exhibits a solder thermal interface material (TIM) 112 between a die 110 and a heat spreader 118 according to an embodiment. The computer image photomicrograph 100 is depicted in exaggerated dimensions for illustrative purposes. The die 110 includes an active surface 114 and a backside surface 116. The active surface 110 exhibits bond pads, one of which is illustrated with reference numeral 111. In an embodiment, the TIM 112 is better represented by a bracket 112 (FIG. 1, left side) as it is a composite of a laminate that has been reflowed. Such embodiments are depicted herein.

In an embodiment, the die 110 is a semiconductive material such as monocrystalline silicon that has been processed into integrated circuits (ICs). In an embodiment, the die 110 is a thinned die that has been size-reduced by a process such as backside grinding or the like. In an embodiment, the die 110 has a thickness in a range from about 100 µm to about 300 µm. In an embodiment, the die 110 has a thickness in a range from about 125 µm to about 200 µm.

In an embodiment where the die 110 has a thickness in a range from about 125 µm to about 200 µm, the heat spreader 118 has a thickness in a range from about 1 mm to about 3 mm. In an embodiment where the die 110 has a thickness in a range from about 125 µm to about 300 µm, the heat spreader 118 has a thickness of about 2.4 mm.

In an embodiment, the die 110 has a backside metallization (BSM) 128 including a titanium first layer 120, a nickel-vanadium second layer 122 and a gold third layer 124. The BSM can be referred to as the BSM 128 in an embodiment. In an embodiment, a conventional BSM 128 is used. Other BSMs that can be used may have various numbers of layers and types of materials.

As depicted in FIG. 1, the die 110 has been bonded to the heat spreader 118 with the solder TIM 112 according to an embodiment. In an embodiment, the heat spreader 118 has been prepared with a cladding 126 that includes a metal such as a copper layer 126.

In an embodiment, FIG. 1 refers to a portion of an article 100 in which the solder TIM 112 has a voids fraction that is less than about 1% by volume. In an embodiment, the article 100 includes a solder TIM 112 that has a voids fraction that is less than about 0.5%. In an embodiment, the article 100 includes a solder TIM 112 that has a voids fraction that is less than about 0.1%. The voids fraction can be analyzed by any known method, such as the Archimedes method, which determines a known density for a given eutectic solder. The voids fraction can also be determined by use of a scanning acoustic microscope (SAM).

In an embodiment, the copper surface cladding 126 interfaces with the TIM 118. In an embodiment, the copper surface cladding 126 has only the area dimension of the die 110, (although the copper surface cladding 126 in FIG. 1 shows the area dimension of the heat spreader 118). In an embodiment, the heat spreader 118 has an aluminum-silicon-carbide (AlSiC) with a copper surface cladding 126 on the die side of the heat spreader 118. In an embodiment, the heat spreader 118 has is a graphite material with a copper surface cladding 126 on the die side of the heat spreader 118. In an embodiment, the heat spreader 118 is copper and no cladding 126 is present such that the solder TIM 112 embodiment makes direct contact with the copper heat spreader 118.

In an embodiment, a eutectic solder is used that blends with the copper of the heat spreader 118, or with the copper of the copper surface cladding 126 to make an intermetallic material with a high melting point, but which initially reflows at a low melting point. This intermetallic material has the strength and adhesion that is required for a thinned die in the embodiment ranges and thinner, but it imparts a significantly lower compressive stress, if at all, to the die 110.

In various embodiments, a plated metal cladding layer 126, suitable for creating the intermetallic compound with the solderable TIM 112, is used on the die side of the heat spreader 118 to facilitate wetting. In various embodiments, the metal cladding layer 126 is copper. A copper heat spreader 118 or a copper-cladded heat spreader is used. The heat spreader 118 can be constructed of a wide range of heat-spreader materials that have suitable thermal dissipation. Additionally, for an embodiment where the heat spreader material 116 includes copper, a plating process for the heat spreader 116 is eliminated to further decrease cost and time in the production cycle.

In an embodiment, a bimetallic solder composition is used as the solder TIM 112. The solder TIM 112 is produced without the use of a flux. The solder TIM 112 is placed against the copper of the heat spreader 118. In an embodiment, the solder TIM 112 is an alloy when layered. Accordingly, the solder TIM 112 is a layered structure that will reflow and in situ alloy with itself and the copper of the heat spreader 118. In an embodiment, the in situ alloy forms an intermetallic material.

The solder TIM 112, whether an alloy or a layered structure, is bonded between the die 110 and the heat spreader 118 at a first processing temperature of about 120° C. and for a time period from about 1 minute to about 5 minutes in a non-oxidizing environment. Thereafter, the solder TIM 112 is heat aged in a non-oxidizing environment. Heat aging is carried out at the same temperature according to an embodiment. In an embodiment, heat aging is carried out at a second processing temperature of about 180° C. to about 210° C. in a non-oxidizing environment. In an embodiment, the non-oxidizing environment is a nitrogen (N₂) environment. This second processing is carried out for about 5 minutes to about 2 hours at a processing temperature of about 180° C. to about 210° C. In an embodiment, the non-oxidizing environment can be effected at an overpressure in a range from about 7.25 kPa (50 psi) to about 14.5 kPa (100 psi). The solder TIM 112 that results is observed to be substantially void free. Beside the Archimedes method, an analytical technique that can be used to detect the presence of voids is using a scanning acoustic microscope (SAM).

Because of the processing conditions carried out in the disclosed embodiments, the article that results is substantially free of an organic flux or an organic flux residue. By "substantially free" it is meant that under clean-room conditions that are used during die bonding, analytical evaluation of the article at the level of the TIM 112 will result in no detectable flux or flux residue, absent a false positive. Such no detectable flux means that if there were any organic present, it would be below detection, and if not below detection, it would be tracked to a contaminant and not to a residue of a process that was used.

In an embodiment, the solder TIM 112 is an indium-tin (InSn) solder composition such as 52In48Sn as rated by weight comparisons. In an embodiment, the solder TIM 112 is the InSn eutectic solder composition containing 50.9In49.1Sn as rated by weight comparisons.

In an embodiment, the solder TIM 112 was produced without the use of a flux. The solder TIM 112 is formed from an indium layer and a tin layer in a laminate. In an embodiment, the indium layer was about 2.88 μm thick and the tin layer was about 3.12 μm thick. The layered structure was bonded between the die 110 and the heat spreader 118 at a first processing temperature of about 120° C. Thereafter, the solder TIM 112 was heat aged at a second processing temperature of about 180° C. to about 210° C. in a non-oxidizing environment such as in N₂, for about 5 minutes to about 15 minutes. The solder TIM 112 was observed to be substantially void free. Because no flux was used, the article that results is substantially free of a flux or a flux residue.

In an embodiment, the solder TIM 112 was produced without the use of a flux. The solder TIM 112 is formed from an indium layer and a tin layer in a laminate. In an embodiment, the indium layer was from about 5 μm to about 10 μm thick and the tin layer was from about 0.2 μm to about 0.5 μm thick. The layered structure was bonded between the a 125 μm-thick die 110 and a 2.4 mm-thick heat spreader 118 at a first processing temperature of about 12020 C. Thereafter, the solder TIM 112 was heat aged at a second processing temperature of about 180° C. to about 210° C. in an N₂ environment for about 5 minutes to about 15 minutes. The solder TIM 112 was observed to be substantially void free. Because no flux was used, the article that results is substantially free of a flux or a flux residue.

In an embodiment, the solder TIM 112 was produced without the use of a flux. A eutectic InSn solder was plated on the heat spreader 118. The solder TIM 112 was about 7 μm thick. The solder TIM 112 was bonded between the die 110 and the heat spreader 118 at a first processing temperature of about 120° C. Thereafter, the solder TIM 112 was heat aged at a second processing temperature of about 180° C. to about 210° C. in an N₂ environment for about 5 minutes to about 15 minutes. The solder TIM 112 was observed to be substantially void free. Accordingly, the article that results is also substantially free of a flux or a flux residue.

In an embodiment, the solder TIM 112 was produced without the use of a flux. A eutectic InSn solder was formed on the heat spreader 118. The solder TIM 112 was about 7 μm thick. The solder TIM 112 was bonded between the die 110 and the heat spreader 118 at a first processing temperature of about 120° C. Thereafter, the solder TIM 112 was heat aged at a second processing temperature of about 210° C. in an N₂ environment for about 16 minutes. The solder TIM 112 was observed to be completely void free. Accordingly, the article that results is also substantially free of an organic flux or an organic flux residue.

In an embodiment, a solder TIM 112 was prepared that included a pure indium layer of about 6 μm to about 12 μm thickness that was plated with a gold flash layer that was from about 0.1 μm to about 0.5 μm. The indium portion of the solder TIM 112 was placed on the heat sink 118 (or the copper cladding 126 if the heat sink 118 is not copper). During processing the gold flash layer and the indium layer dissolved into each other and reflow was carried out. The solder TIM 112 was bonded between the die 110 and the heat spreader 118 at a first processing temperature of about 120° C. Thereafter, the solder TIM 112 was heat aged at a second processing temperature of about 180° C. to about 210° C. in an N₂ environment for about 5 minutes to about 15 minutes. The solder TIM 112 was observed to be completely void free. Accordingly, the article that results is also substantially free of an organic flux or an organic flux residue.

In an embodiment, the solder TIM 112 was produced without the use of a flux. A eutectic InSn solder was plated on the heat spreader 118. The solder TIM 112 was about 6 μm thick, with a gold flash layer that was about 0.05 μm thick. The solder TIM 112 was bonded between the die 110 and the heat spreader 118 at a first processing temperature of about 120° C. Thereafter, the solder TIM 112 was heat aged at a second processing temperature of about 175° C. in an N₂ environment for about 2 minutes. The solder TIM 112 was observed to be completely void free. Accordingly, the article that results is also substantially free of an organic flux or an organic flux residue.

In an embodiment, the solder TIM 112 was produced without the use of a flux. A eutectic InSn solder was plated on the heat spreader 118. The solder TIM 112 was about 12 μm thick, with a gold flash layer that was about 0.2 μm thick. The solder TIM 112 was bonded between the die 110 and the heat spreader 118 at a first processing temperature of about 120° C. Thereafter, the solder TIM 112 was heat aged at a second processing temperature of about 210° C. in an N₂ environment for about 16 minutes. The solder TIM 112 was observed to be completely void free. Accordingly, the article that results is also substantially free of an organic flux or an organic flux residue.

Figure 2:
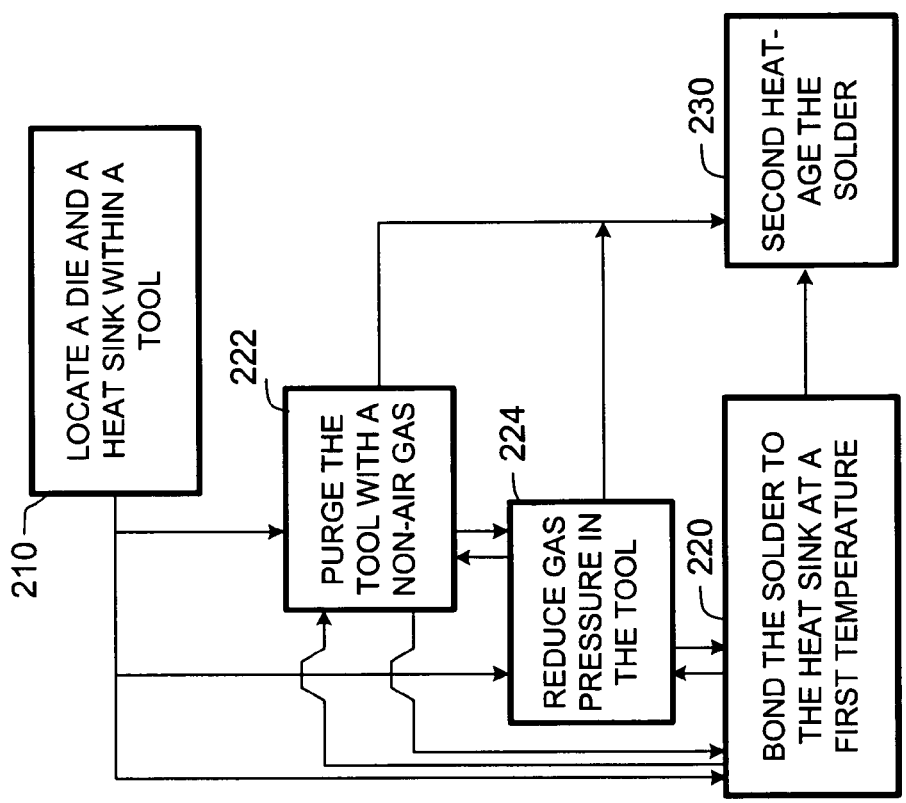
FIG. 2 is a flow chart that describes a process flow according to an embodiment.

FIG. 2 is a flow chart 200 that describes a process flow according to an embodiment. The various processes are depicted in schematic form and several incidental processes are not illustrated for simplicity.

At 210 the process includes locating a die and a heat sink within a tool.

At 220, the process includes bonding the solder to the heat sink surface at a first processing temperature to achieve a solder TIM with a first remelting temperature. By way of non-limiting example, a 52In49Sn solder embodiment is placed upon a die and a heat spreader is pressed against the solder. The first processing temperature is in the range from 115° C. to about 125° C.

At 222, the process includes purging the tool. Purging the tool allows for a substantially oxidation-free atmosphere. A substantially oxidation-free atmosphere can eliminate oxide formations on the solder precursors, such that a selected amount of a reflowed solder TIM is formed without the use of an organic flux. In an embodiment, the process includes purging 222 and bonding 220.

At 230, the process includes heat aging the solder TIM at a second processing temperature that is higher than the first processing temperature. By way of continuing the non-limiting example, the heat aging of a solder TIM is done in a range from about 175° C. to about 215° C. and for a time from about five minutes to about two hours. The solder TIM thereafter has a solder second remelting temperature that is higher than the solder first remelting temperature. By this process embodiment, a high melting-point solder is manufactured that first reflows in the temperature range from about 115° C. to about 125° C. This low first temperature allows for a significantly lower compressive stress in the die.

In an embodiment, the process can repeat at least one of purging 222 and reducing the gas pressure 224 as a preprocess for heat aging. In this way, the need for a solder flux is also reduced.

Figure 3:
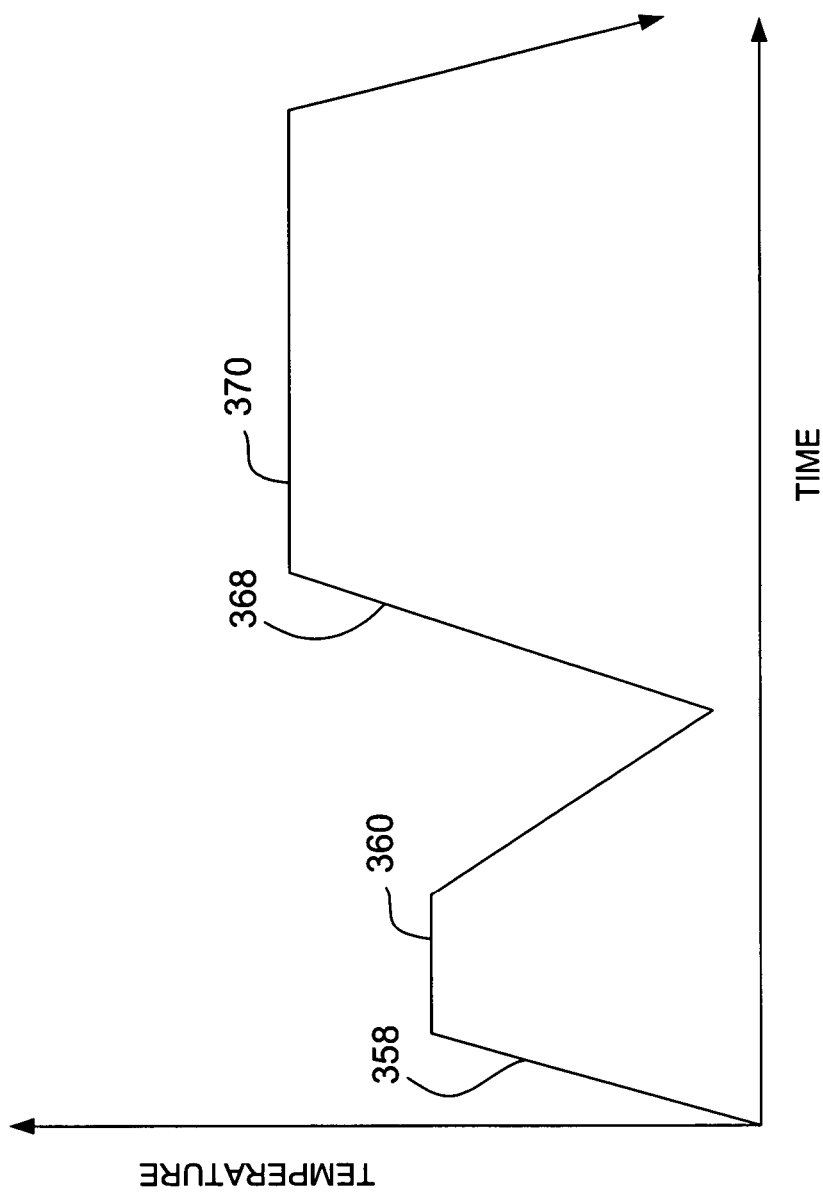
FIG. 3 is a heat-versus-time processing graphic according to an embodiment.

FIG. 3 is a heat-versus-time processing graphic according to an embodiment. The process includes first bonding the solder TIM to the heat sink at a first processing temperature 360. A first ramp-up rate 358 is depicted at an arbitrary slope. The first processing temperature is in the range from about 115° C. to about 125° C. This low first temperature allows for a significantly lower compressive stress in the die. After first bonding, the process includes a second heat aging of the solder TIM at a second processing temperature 370. A second ramp-up rate 368 is depicted at an arbitrary slope, and the cool-down in the graph is depicted arbitrarily. The second processing temperature is in the range from about 175° C. to about 215° C.

Figure 4:
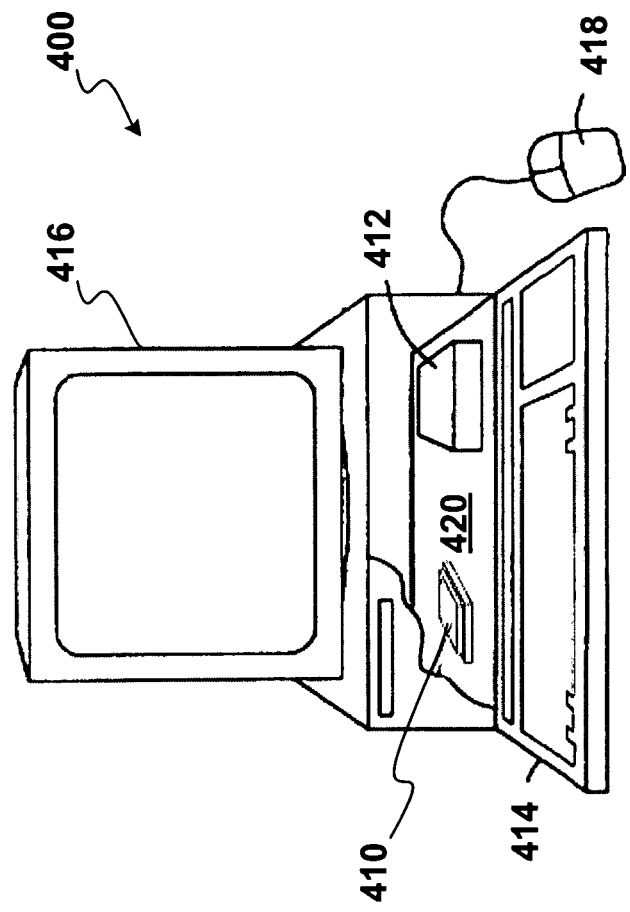
FIG. 4 is a cut-away elevation that depicts a computing system according to an embodiment.

FIG. 4 is a cut-away elevation that depicts a computing system 400 according to an embodiment. One or more of the foregoing embodiments of the reflowed solder TIM structures may be utilized in a computing system, such as a computing system 400 of FIG. 4. Hereinafter any flux-free or flux residue free solder TIM embodiment alone or in combination with any other embodiment is referred to as an embodiment(s) configuration.

The computing system 400 includes at least one processor, which is enclosed in a package 410, a data storage system 412, at least one input device such as a keyboard 414, and at least one output device such as a monitor 416, for example. The computing system 400 includes a processor that processes data signals, and may include, for example, a microprocessor, available from Intel Corporation. In addition to the keyboard 414, the computing system 400 can include another user input device such as a mouse 418, for example. The computing system 500 can include a structure, after processing as depicted in FIG. 1, including the die 110, the solder TIM 112, and the heat spreader 118.

For purposes of this disclosure, a computing system 400 embodying components in accordance with the claimed subject matter may include any system that utilizes a microelectronic device system, which may include, for example, at least one of the reflowed solder TIM structure embodiments that is coupled to data storage such as dynamic random access memory (DRAM), polymer memory, flash memory, and phase-change memory. In this embodiment, the embodiment(s) is coupled to any combination of these functionalities by being coupled to a processor. In an embodiment, however, an embodiment(s) configuration set forth in this disclosure is coupled to any of these functionalities. For an example embodiment, data storage includes an embedded DRAM cache on a die. Additionally in an embodiment, the embodiment(s) configuration that is coupled to the processor (not pictured) is part of the system with an embodiment(s) configuration that is coupled to the data storage of the DRAM cache. Additionally in an embodiment, an embodiment(s) configuration is coupled to the data storage 412.

In an embodiment, the computing system 400 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP (not pictured) is part of a chipset that may include a stand-alone processor and the DSP as separate parts of the chipset on the board 420. In this embodiment, an embodiment(s) configuration is coupled to the DSP, and a separate embodiment(s) configuration may be present that is coupled to the processor in the package 410. Additionally in an embodiment, an embodiment(s) configuration is coupled to a DSP that is mounted on the same board 420 as the package 410. It can now be appreciated that the embodiment(s) configuration can be combined as set forth with respect to the computing system 500, in combination with an embodiment(s) configuration as set forth by the various embodiments of the flux-free or flux residue free solder TIM within this disclosure and their equivalents.

It can be appreciated that embodiments set forth in this disclosure can be applied to devices and apparatuses other than a traditional computer. For example, a die can be packaged with an embodiment(s) configuration, and placed in a portable device such as a wireless communicator or a handheld device such as a personal data assistant and the like. Another example is a die that can be packaged with an embodiment(s) configuration and placed in a vehicle such as an automobile, a locomotive, a watercraft, an aircraft, or a spacecraft.

Figure 5:
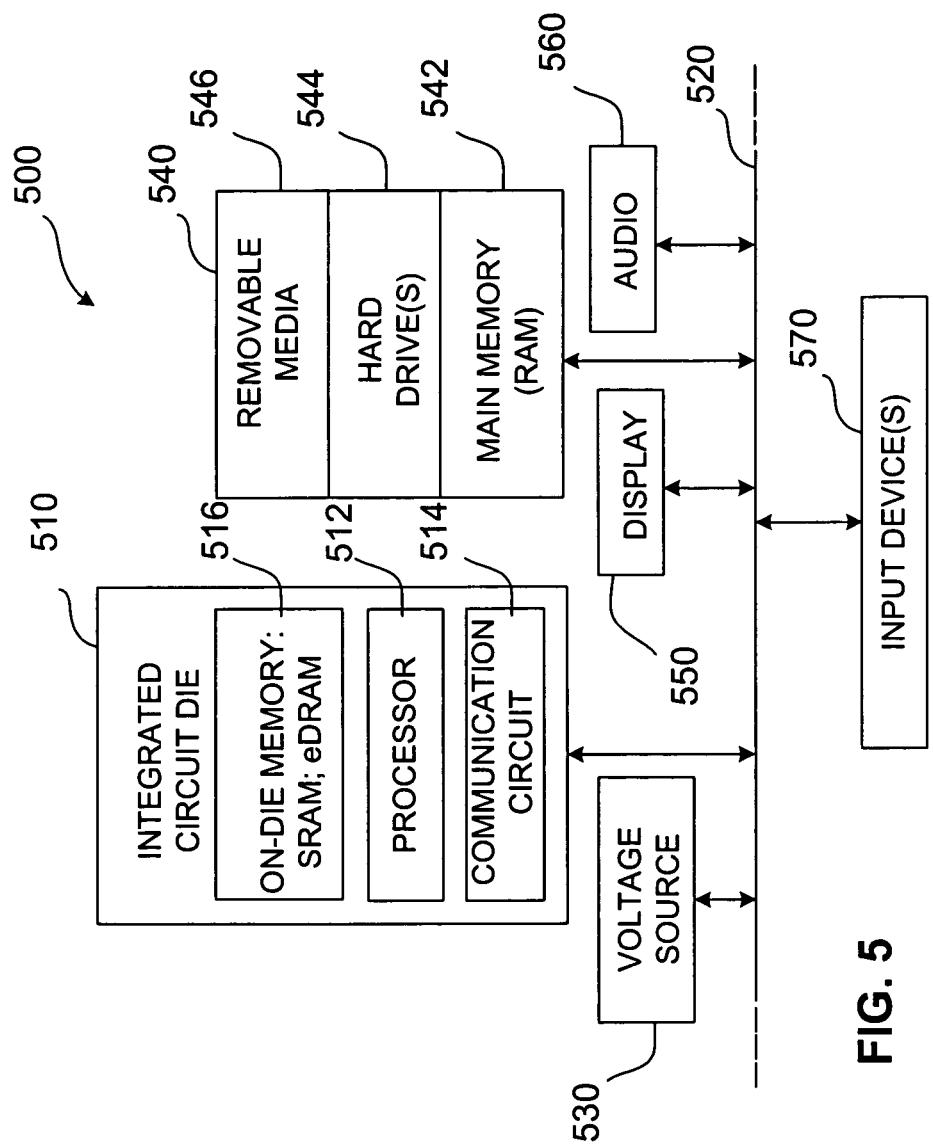
FIG. 5 is a schematic of a computing system according to an embodiment.

FIG. 5 is a schematic of a computing system according to an embodiment. The electronic system 500 as depicted can embody the computing system 400 depicted in FIG. 4, but the electronic system is depicted more generically and includes the flux-free or flux residue free solder TIM embodiment for at least one component. The electronic system 500 incorporates at least one electronic assembly 510, such as an IC die illustrated in FIG. 1. In an embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 630 supplies current to the integrated circuit 510 through the system bus 520.

The integrated circuit 510 is electrically coupled to the system bus 520 and includes any circuit, or combination of circuits according to an embodiment. In an embodiment, the integrated circuit 510 includes a processor 512 that can be of any type. As used herein, the processor 512 means any type of circuit such as, but not limited to, a microprocessor, a microcontroller, a graphics processor, a digital signal processor, or another processor. Other types of circuits that can be included in the integrated circuit 510 are a custom circuit or an ASIC, such as a communications circuit 514 for use in wireless devices such as cellular telephones, pagers, portable computers, two-way radios, and similar electronic systems. In an embodiment, the processor 510 includes on-die memory 516 such as SRAM. In an embodiment, the processor 510 includes on-die memory 516 such as eDRAM.

In an embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital video disks (DVDs), flash memory keys, and other removable media known in the art.

In an embodiment, the electronic system 500 also includes a display device 550, an audio output 560. In an embodiment, the electronic system 500 includes a controller 570, such as a keyboard, mouse, trackball, game controller, microphone, voice-recognition device, or any other device that inputs information into the electronic system 500.

As shown herein, integrated circuit 510 can be implemented in a number of different embodiments, including an electronic package, an electronic system, a computer system, one or more methods of fabricating an integrated circuit, and one or more methods of fabricating an electronic assembly that includes the integrated circuit and the flux-free or flux residue free solder TIM as set forth herein in the various embodiments and their art-recognized equivalents. The elements, materials, geometries, dimensions, and sequence of operations can all be varied to suit particular packaging requirements.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising: forming a solder on a heat sink surface, wherein the solder is an In layer on the heat sink and an Au flash layer above and on the In layer; bonding the solder to the heat sink surface at a first processing temperature to achieve a solder first remelting temperature and a remelted solder, and wherein the remelted solder and the heat sink surface are substantially free of organic flux and organic flux residue.

2. The process of claim 1, wherein the In layer has a thickness in a range from about 5 μm to about 13 μm, wherein the Au flash layer has a thickness in a range from about 0.08 μm to about 0.52 μm, the process further including: heat aging at a second processing temperature range from about 50° C. to about 100° C. above the first processing temperature.

3. The process of claim 2, wherein at least one of bonding at the first processing temperature and heat aging at the second processing temperature is done in a non-oxidizing gas environment.

4. The process of claim 1, further including: heat aging at a second processing temperature range from about 50° C. to about 100° C. above the first processing temperature a time range from about 10 minutes to about 2 hours.

5. A process comprising:

forming a solder on a heat sink surface, wherein the solder is an In layer on the heat sink and an Au flash layer above and on the In layer, wherein the In layer has a thickness in a range from about 5 μm to about 13 μm, wherein the Au flash layer has a thickness in a range from about 0.08 μm to about 0.52 μm;

bonding the solder to the heat sink surface at a first processing temperature to achieve a solder first remelting temperature and a remelted solder, and wherein the remelted solder and the heat sink surface are substantially free of organic flux and organic flux residue; and heat aging at a second processing temperature range from about 50° C. to about 100° C. above the first processing temperature, wherein at least one of bonding at the first processing temperature and heat aging at the second processing temperature is done in a non-oxidizing gas environment and an overpressure in a range from about 7.25 kPa (50 psi) to about 14.5 kPa (100 psi).

6. The process of claim 5, further including:

thinning a die to a thickness range from 100 μm to 210 μm;

wherein bonding results in a voids fraction in the solder in a range from 0.1% voids to 1% voids; and bonding the die to the to the solder.

7. The process of claim 5, wherein heat aging at the second processing temperature range is done above the first processing temperature a time range from about 10 minutes to about 2 hours.

* * * * *